(12) United States Patent
Park et al.

(10) Patent No.: US 12,040,134 B2
(45) Date of Patent: Jul. 16, 2024

(54) CAPACITOR ASSEMBLY MANUFACTURING APPARATUS AND CAPACITOR ASSEMBLY MANUFACTURING METHOD USING SAME

(71) Applicant: Samwha Electric Co., Ltd., Cheongju-si (KR)

(72) Inventors: Jong On Park, Cheongju-si (KR); Tae Yun Kim, Sejong (KR); Eun Kyun Joo, Cheongju-si (KR); Young Jin Kwon, Cheongju-si (KR); Jin Ho Kim, Cheongju-si (KR); Geun Ju Cha, Cheongju-si (KR); Chan Ser Jeon, Cheongju-si (KR)

(73) Assignee: Samwha Electric Co. Ltd., Cheongju-si (KR)

( * ) Notice: Subject to any disclaimer, the term of this patent is extended or adjusted under 35 U.S.C. 154(b) by 176 days.

(21) Appl. No.: 17/765,029

(22) PCT Filed: Jun. 15, 2021

(86) PCT No.: PCT/KR2021/007507
§ 371 (c)(1),
(2) Date: Mar. 30, 2022

(87) PCT Pub. No.: WO2022/035037
PCT Pub. Date: Feb. 17, 2022

(65) Prior Publication Data
US 2022/0375698 A1    Nov. 24, 2022

(30) Foreign Application Priority Data
Aug. 14, 2020 (KR) .................. 10-2020-0102271

(51) Int. Cl.
*H01G 13/00* (2013.01)
*G01R 31/64* (2020.01)
(Continued)

(52) U.S. Cl.
CPC ............. *H01G 13/00* (2013.01); *G01R 31/64* (2020.01); *H01G 2/04* (2013.01); *H01G 2/106* (2013.01); *H02J 7/345* (2013.01)

(58) Field of Classification Search
CPC .......... H01G 9/28; H01G 9/0029; H01G 9/06; H01G 9/008; H01G 9/15; H01G 9/004; H01G 9/08
See application file for complete search history.

(56) References Cited

FOREIGN PATENT DOCUMENTS

| CN | 106449184 A | 2/2017 |
|---|---|---|
| CN | 208615517 U | 3/2019 |

(Continued)

OTHER PUBLICATIONS

JP-09036001-A English translation submitted by applicant (Year: 1997).*
KR-2052763-B1 English translation submitted by applicant (Year: 2019).*

*Primary Examiner* — Jason L Vaughan
*Assistant Examiner* — Amanda Kreiling
(74) *Attorney, Agent, or Firm* — Sisson & Banyas, Attorneys at Law, LLC; Jeffrey J. Banyas

(57) ABSTRACT

An apparatus for assembling a capacitor assembly and a method for assembling the capacitor assembly using the same according to the present disclosure includes: a processing module mechanically, electrically coupling a capacitor to a bracket to assemble to a capacitor assembly, a test module testing whether the assembled capacitor assembly normally operates, and a conveyor module in which the capacitor assembly is arranged to sequentially perform the processing and test processes while moving in one direction, and it is possible to precisely detect whether the capacitor assembly is defective through two or more tests, and if many mechanical defects occur, it is possible to reduce the pos- (Continued)

sibility of occurrence of the mechanical defect by controlling and adjusting some of the processing modules and improve productivity.

19 Claims, 9 Drawing Sheets

(51) Int. Cl.
*H01G 2/04* (2006.01)
*H01G 2/10* (2006.01)
*H02J 7/34* (2006.01)

(56) References Cited

FOREIGN PATENT DOCUMENTS

| | | | | |
|---|---|---|---|---|
| CN | 111330809 | A | 6/2020 | |
| CN | 210865937 | U | 6/2020 | |
| JP | H3-48755 | A | 3/1991 | |
| JP | 09-036001 | A | 2/1997 | |
| JP | 09036001 | A * | 2/1997 | |
| JP | 200081319 | A | 3/2000 | |
| KR | 10-1999-0046434 | A | 7/1999 | |
| KR | 10-0909030 | B1 | 7/2009 | |
| KR | 10-2052763 | B1 | 12/2019 | |
| KR | 2052763 | B1 * | 12/2019 | ........... H01G 9/0029 |
| WO | 2018-143354 | A1 | 8/2018 | |
| WO | 2020-121872 | A1 | 6/2020 | |

\* cited by examiner

[FIG. 1]

[FIG. 5]
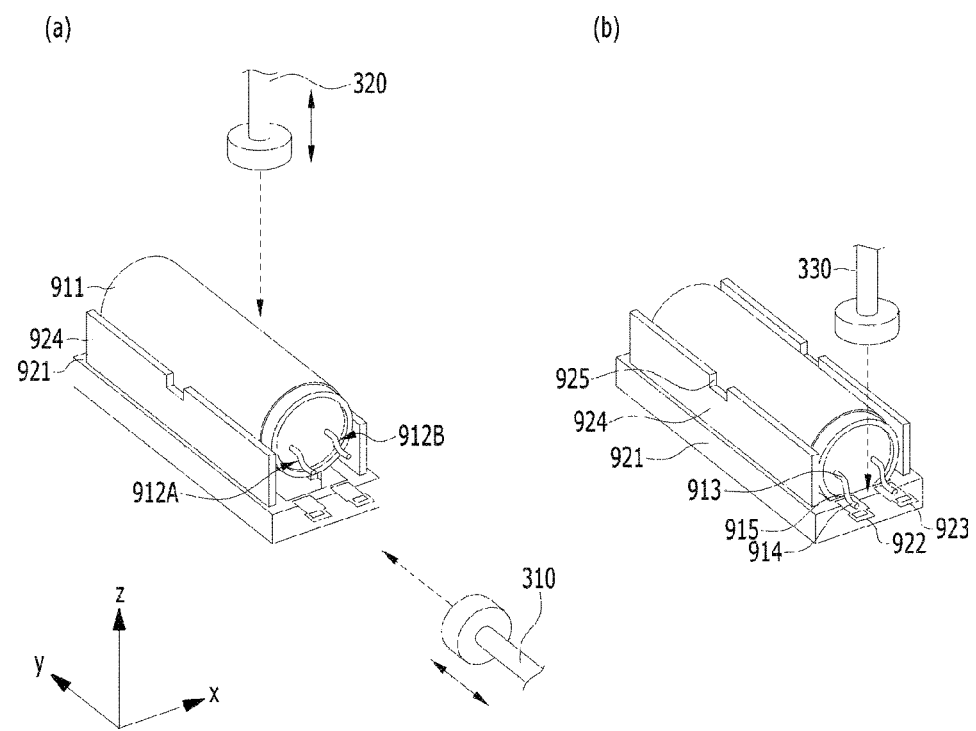

[FIG. 6]
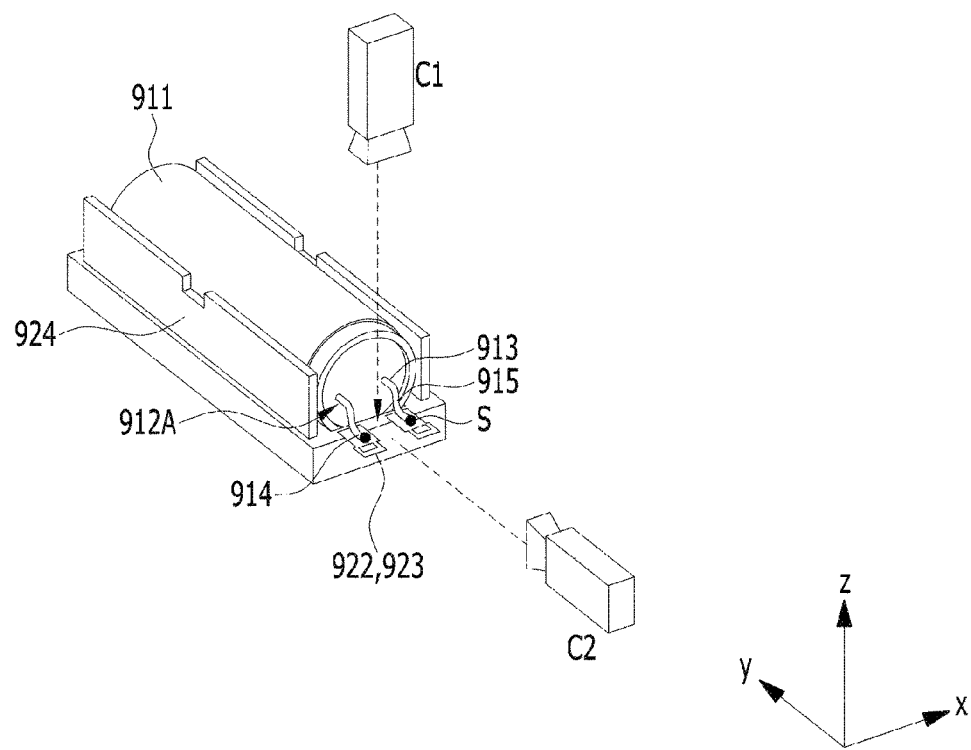

[FIG. 7]
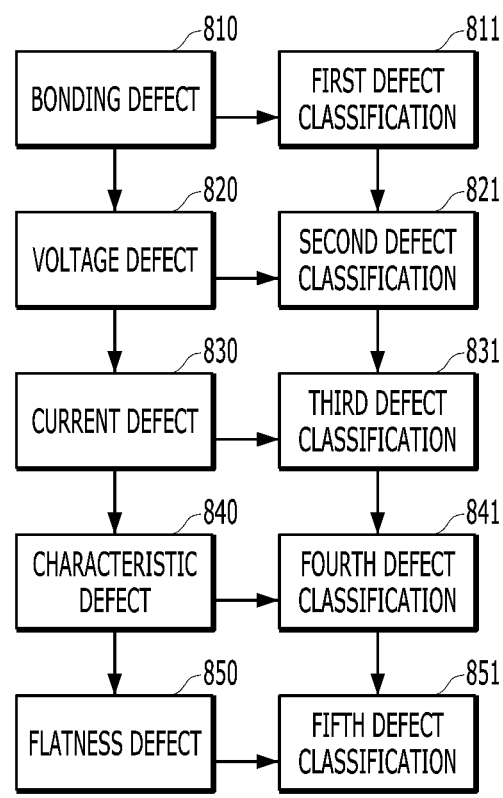

[FIG. 8]
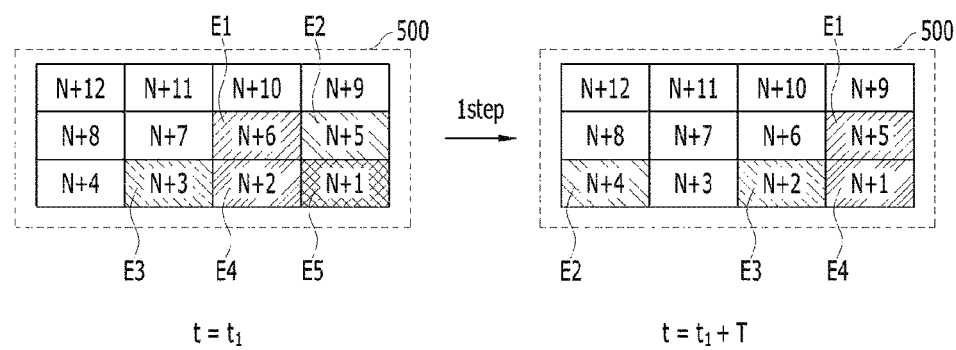

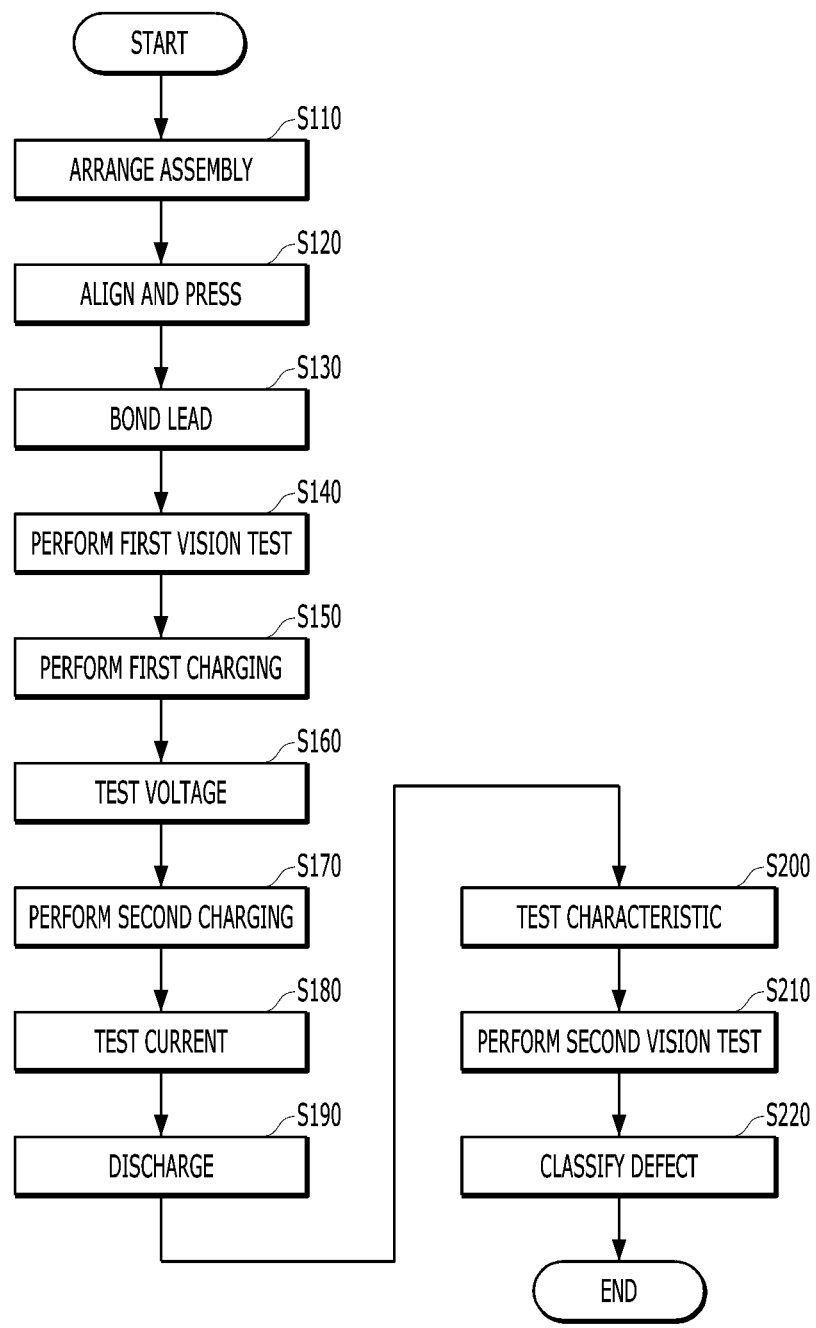
[FIG. 9]

CAPACITOR ASSEMBLY MANUFACTURING APPARATUS AND CAPACITOR ASSEMBLY MANUFACTURING METHOD USING SAME

PRIORITIES AND CROSS REFERENCES

This application claims priority from International Application No. PCT/KR2021/007507 filed on 15 Jun. 2021 and Republic of Korea Application No. 10-2020-0102271 filed on 14 Aug. 2020, the teachings of each of which are incorporated by reference herein in their entirety.

TECHNICAL FIELD

The present disclosure relates to an apparatus for assembling a capacitor assembly and a method for assembling the capacitor assembly using the same.

BACKGROUND ART

A capacitor is a device that temporarily stores electricity in an electronic circuit, and is referred to as a condenser. In general, a capacitor has a structure in which a dielectric with insulating property is formed between two conductor electrodes, and serves to suppress a sudden rise or drop in voltage by storing energy by inducing a (−) charge in one electrode and a (+) charge in the other electrode when a voltage is applied between the two electrodes of the capacitor and charging or discharging the charges by using this energy storage principle. Due to this role of the capacitor, the capacitor is one of the essential elements in constituting the electronic circuit.

Meanwhile, the capacitor may have a main body of the capacitor having different charges induced therein and having a dielectric, and a pair of leads connected to each conductor electrode and coupled to the electronic circuit to flow a current. Conventionally, the lead is directly bonded to a circuit board through soldering, etc., but in this case, there is a disadvantage in that the lead occupies many heights in a planar direction of the circuit board and therefore, a space in which the circuit board is arranged is not efficiently utilized. In addition, if the lead is arranged to be bent to reduce the height, a bent portion is broken and therefore, the capacitor may be separated from the circuit board and there is a risk of causing the failure of the electronic device.

Therefore, to solve this problem, a method for constituting an assembly by cutting the lead of the capacitor to couple it to a bracket is being attempted. To constitute this assembly, there exists a continuing demand in the industry for the equipment and method for processing a capacitor in a uniform shape and testing whether the processed capacitor is mechanically, electrically normal.

SUMMARY OF INVENTION

Technical Problem

To solve the above problems, an object of the present disclosure is to provide an apparatus for assembling a capacitor assembly, which arranges a capacitor and a bracket in a conveyor module and processes the capacitor and the bracket to be integrally formed to test whether a capacitor assembly is normally operated.

In addition, another object of the present disclosure is to provide a method for assembling a capacitor assembly, which has a time-series assembling order to be performed to assemble this capacitor assembly and simultaneously performs these assembling steps.

The objects of the present disclosure are not limited to the aforementioned objects, and other objects not mentioned will be able to be clearly understood to those skilled in the art from the following description.

Solution to Problem

An apparatus for assembling a capacitor assembly coupling a capacitor having leads with the same length and a bracket including a pair of accommodating partition walls accommodating the capacitor therein to assemble to a capacitor assembly according to the present disclosure may include: a conveyor module including a plurality of assembling regions, the assembling regions being moved in one direction in a state where the capacitor assembly is seated on the assembling region, a processing module mechanically, electrically coupling the capacitor to the bracket to assemble to the capacitor assembly, and a test module testing whether the capacitor assembly mechanically, electrically coupled by the processing module is defective.

In addition, the conveyor module may move the assembling regions in one direction, and the assembling regions may be moved every preset unit time by a certain distance.

In addition, the assembling regions may include a processing region including an alignment and press region where the capacitor assembly is mechanically assembled and a lead bonding region where the capacitor and the bracket constituting the capacitor assembly are electrically connected, a test region including a vision test region where a lead bonding state is visually tested and an electrical test region where electrical characteristics of the capacitor assembly is tested to test whether the capacitor assembly formed by the coupling in the processing region is defective, and a defective product classification region where whether the capacitor assembly is defective is determined depending upon the test results in the test region to classify it as at least one item, in which the capacitor of the capacitor assembly may include a pair of leads including a first lead region having one end protruding from a main body of the capacitor, a bending region having one end connected to the other end of the first lead region and formed to be bent to have a preset angle with respect to the first lead region, and a second lead region having one end connected to the other end of the bending region and formed in parallel with the first lead region.

In addition, the processing module may be formed at a position corresponding to the processing region, and the test module may be formed at a position corresponding to the test region to perform the processing of the capacitor assembly and the test of the capacitor assembly, respectively.

In addition, the processing module may include a bracket alignment module moving in parallel in a first direction to adjust a position of the bracket so that the bracket is correctly positioned in a first press region, a capacitor main body pressurization module moving in parallel in a second direction perpendicular to the first direction to pressurize the main body of the capacitor to be accommodated between the accommodating partition walls of the bracket, a lead pressurization module moving in parallel in the second direction to pressurize and bend the leads of the capacitor to be in contact with a pair of electrodes formed on a base of the bracket, and a lead bonding module treating an electrically conductive material so that the lead of the capacitor and the electrode of the bracket are electrically connected.

In addition, the lead bonding module may electrically connect the lead of the capacitor to the electrode of the bracket through a soldering treatment.

In addition, the test module may include a plurality of vision test modules visually detecting whether the lead is bonded, and the vision test module may include a first vision test module detecting whether the lead is bonded from the second direction, and a second vision test module detecting whether the lead is bonded from the first direction.

In addition, the test module may further include a first charging module charging the capacitor for a first charging time, a voltage test module testing an applied voltage from the capacitor charged by the first charging module, a second charging module charging the capacitor for a second charging time after the test of the voltage test module, a current test module testing a current applied to the capacitor, a discharging module formed as a ground to discharge the power of the capacitor after the voltage test and the current test, and a characteristic test module measuring the characteristics of the capacitor including a capacitance, in which the second charging time may be set to be longer than the first charging time.

In addition, the second charging time may have a unit time 2 to 6 times the first charging time.

In addition, the first charging time may be N unit times, and each of the N first charging modules may perform charging by dividing the first charging time into the 1 unit time, and the second charging time may be 2N to 6N unit times, and each of the 2N to 6N second charging modules may perform charging by dividing the second charging time into the 1 unit time.

In addition, the voltage test module, the current test module, and the characteristic test module may be formed between the first vision test module and the second vision test module.

In addition, the test module may further include a defective product classification module determining whether the capacitor assembly is defective by detecting the mechanical defect of the capacitor assembly according to the tests of the first vision test module and the second vision test module, and the electrical defect of the capacitor assembly according to the voltage test module, the current test module, and the characteristic test module to classify it into at least one item.

In addition, the item may be classified into a mechanically defective assembly and an electrically defective assembly.

In addition, the apparatus for assembling the capacitor assembly may further include a control part configured to control to apply a feedback to the processing module according to the mechanically defective assembly, in which the control part may increase a bonding time of the lead bonding module if it is determined that there is the mechanical defect of the capacitor assembly depending upon the test of the first vision test module, and the control part may increase a pressurization intensity of the lead pressurization module if it is determined that there is the mechanical defect of the capacitor assembly depending upon the test of the second vision test module.

Meanwhile, a method for assembling a capacitor assembly coupling a capacitor having leads with the same length to a bracket including a pair of accommodating partition walls accommodating the capacitor therein to assemble to the capacitor assembly according to the present disclosure may include: processing the capacitor and the bracket included in the capacitor assembly to assemble the capacitor assembly and testing whether the capacitor assembly mechanically, electrically coupled by the processing is defective, with respect to the capacitor assembly seated on a conveyor module including a plurality of assembling regions, the assembling regions being moved in one direction, in which the processing may include aligning and pressing that fits and couples the capacitor between the accommodating partition walls of the bracket by pressurizing the capacitor and the bracket from a first direction and a second direction perpendicular to the first direction to mechanically couple the capacitor to the bracket, and bonding the lead that performs the bonding to electrically connect the leads of the capacitor to a pair of electrodes formed on one surface of the bracket after the aligning and pressing, and in the processing, the capacitor of the capacitor assembly may include a pair of leads including a first lead region having one end protruding from a main body of the capacitor, a bending region having one end connected to the other end of the first lead region and formed to be bent to have a preset angle with respect to the first lead region, and a second lead region having one end connected to the other end of the bending region and formed in parallel with the first lead region.

In addition, the aligning and pressing may pressurize and correctly position the bracket in the first direction to align a position of the bracket in a first press region among the assembling regions of the conveyor module, pressurize the main body of the capacitor in the second direction perpendicular to the first direction so that the main body of the capacitor is fitted and coupled between the accommodating partition walls in the first press region, and pressurize the lead of the capacitor in the second direction so that the lead of the capacitor is in contact with the electrode of the bracket in a second press region formed adjacent to the first press region among the assembling regions of the conveyor module.

In addition, the testing may include performing a first vision test that captures the capacitor assembly from the second direction and visually tests whether the lead and the electrode are bonded in the bonding of the lead, testing a voltage that tests whether the capacitor assembly operates in a normal voltage range by charging the capacitor after the performing of the first vision test, testing a current that tests whether the capacitor assembly operates in a normal current range by charging the capacitor after the testing of the voltage, testing a characteristic that discharges the capacitor and tests the characteristics of the capacitor assembly including a capacitance of the capacitor, and performing a second vision test that captures the capacitor assembly from the first direction and visually detects whether the lead and the electrode are bonded in the bonding of the lead.

In addition, the method may further include: performing a first charging that charges the capacitor for N unit times before the testing of the voltage, and performing a second charging that charges the capacitor for 2N to 6N unit times before the testing of the current, in which the performing of the first charging may perform, by each of N first charging modules, the charging by dividing the charging time into the 1 unit time, and the performing of the second charging may perform, by each of 2N to 6N second charging modules, the charging by dividing the charging time into the 1 unit time.

In addition, the method may further include: after the testing, classifying a defect that classifies the capacitor assembly whose bonding is defective or the capacitor assembly having the capacitor not operated in a normal range in the testing, in which the classifying of the defect may classify the defect into a mechanical defect detected through the performing of the first vision test and the performing of the second vision test that visually detect whether the lead and the electrode are bonded, and an electrical defect detected through the testing of the voltage, the testing of the current, and the testing of the characteristic that detect the electrical characteristics of the capacitor assembly.

In addition, if the mechanical defect occurs at a certain rate or more according to the classifying of the defect, in the processing, a pressurization force of the capacitor or the bracket may be adjusted, or a bonding time between the capacitor and the bracket may be adjusted.

Advantageous Effects of Invention

By using the apparatus for assembling the capacitor assembly and the method for assembling the capacitor assembly according to the present disclosure, it is possible to constitute the compact circuit through the capacitor assembly having the capacitor processed by the apparatus for assembling the capacitor assembly because the overall volume occupied by the circuit is reduced by processing the capacitor so that the capacitor may be mounted on the circuit board in the form of the capacitor assembly.

In addition, it is possible to enable the automatic assembling by simultaneously performing different assembling processes so that the plurality of capacitors and brackets are coupled to assemble to the capacitor assembly.

In addition, it is possible to test whether there is the defect through the plurality of test steps in the assembling process to identify the defective product, thereby preventing the defective assembly from being manufactured, and to provide the feedback to the processing module if necessary, thereby reducing the defect rate of the capacitor assembly.

In addition, it is possible to accurately test the defect by double-testing the mechanical defect and the electrical defect in testing whether there is the defect.

BRIEF DESCRIPTION OF DRAWINGS

FIG. 5 is a reference view showing a process of performing alignment and press in an alignment and press region in the apparatus for assembling the capacitor assembly according to the present disclosure.

FIG. 6 is a reference view showing a process of performing a vision test in the apparatus for assembling the capacitor assembly according to the present disclosure.

FIG. 7 is a schematic view for classifying a defect in the apparatus for assembling the capacitor assembly and a method for assembling the capacitor assembly according to the present disclosure.

FIG. 8 is a view schematically showing the current status of the defect monitored by a display part over unit time in the apparatus for assembling the capacitor assembly and the method for assembling the capacitor assembly according to the present disclosure.

FIG. 9 is a flowchart showing the method for assembling the capacitor assembly using the apparatus for assembling the capacitor assembly according to the present disclosure.

DESCRIPTION OF SYMBOLS

Figure 1:
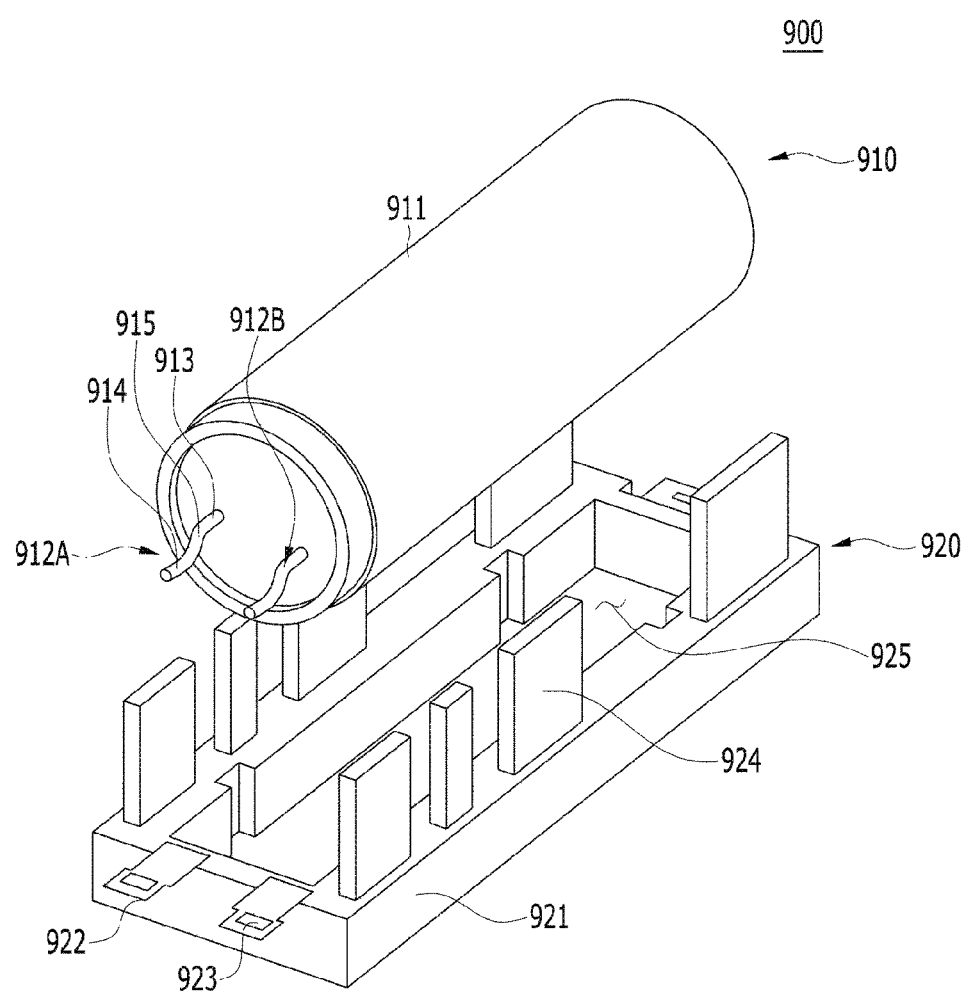
FIG. 1 is a perspective view of a capacitor assembly manufactured by an apparatus for assembling the capacitor assembly according to the present disclosure.

900: Capacitor assembly 910: Capacitor
911: Capacitor main body 912A, 912B: Lead
913: First lead region 914: Second lead region
915: Bending region 920: Bracket
921: Bracket base 922: First bracket electrode
923: Second bracket electrode 924: Accommodating partition wall
925: Slit
100: Conveyor module 110: Capacitor assembly arrangement region
120: Alignment and press region 121: Capacitor assembly alignment region
122: First press region 123: Second press region
130: Lead bonding region 131: First lead bonding region
132: Second lead bonding region 140: First vision test region
150: First power test region 151a, 151b: First charging region
152: Voltage test region 160: Second power test region
161a, 161n: Second charging region 162: Current test region
170: Discharging region 180: Characteristic test region
190: Second vision test region 200: Defect classification region
210: Loading region
300: Processing module 310: Bracket alignment module
320: Capacitor main body pressurization module 330: Lead pressurization module
340: Lead bonding module 341: First lead bonding module
342: Second lead bonding module
400: Test module 410: First vision test module
420: First power test module 421a, 421b: First charging module
422: Voltage test module 430: Second power test module
431a, 431b: Second charging module 432: Current test module
440: Discharging module 450: Characteristic test module
460: Second vision test module 470: Defect classification module
500: Display part S: Bonding part
C1: First vision camera C2: Second vision camera
S110: Arranging capacitor assembly S120: Aligning and pressing
S130: Bonding lead S140: Performing first vision test
S1S0: Performing first charging S160: Testing voltage
S170: Performing second charging S180: Testing current
S190: Discharging S200: Testing characteristic
S210: Performing second vision test S220: Classifying defect

DESCRIPTION OF EMBODIMENTS

Hereinafter, some exemplary embodiments of the present disclosure will be described in detail with reference to exemplary drawings. In adding reference numerals to the components of each drawing, it should be noted that the same components are denoted by the same reference numerals if possible even though they are shown in different drawings. In addition, in describing the exemplary embodiment of the present disclosure, if it is determined that a detailed description of a related known configuration or function interferes with the understanding of the exemplary embodiment of the present disclosure, the detailed description thereof will be omitted.

In describing the components according to the exemplary embodiment of the present disclosure, the terms such as first, second, A, B, (a), and (b) may be used. These terms are merely to distinguish the component from other components, and the natures, orders, or orders of the corresponding components are not limited by the terms. In addition, unless defined otherwise, all terms used herein, including technical or scientific terms, have the same meanings as generally understood by those skilled in the art to which the present disclosure pertains. The terms as defined in the dictionaries used commonly should be interpreted as having the meanings consistent with the contextual meanings of the relevant technology, and unless clearly defined otherwise in the present application, should be not interpreted as ideally or excessively formal meanings.

FIG. 1 is a perspective view of a capacitor assembly manufactured by an apparatus for assembling the capacitor assembly according to the present disclosure.

FIG. 1 shows a capacitor assembly 900 to be assembled by an apparatus for assembling the capacitor assembly according to the present disclosure. The capacitor assembly 900 may include a capacitor 910 including a main body 911 and a pair of leads 912A, 912B formed to protrude from the main body 911 and having the same length. At this time, the capacitor 910 may be an electrolytic capacitor, and the main body 911 may have a cylindrical shape.

The pair of leads 912A, 912B having a regular interval may be formed on one surface of the main body 911 of the capacitor to extend and protrude from the main body 911. FIG. 1 shows the pair of leads 912A, 912B having the same length, and the conventional capacitor may have lengths of the leads 912A, 912B formed differently to indicate their own polarities. However, in the apparatus for assembling the capacitor assembly and the method for assembling the capacitor assembly according to the present disclosure, the leads 912A, 912B may be formed to have the same length to stably bond the leads 912A, 912B to electrodes 922, 923 of a bracket 920. Meanwhile, the pair of leads 912A, 912B may include a first lead region 913 having one end formed to protrude from the main body 911 to be bonded to the electrodes 922, 923 more stably, a bending region 915 having one end connected to the other end of the first lead region 913 and formed to be bent to have a preset angle with respect to the first lead region 913, and a second lead region 914 having one end connected to the other end of the bending region 915 and formed to be substantially parallel to the first lead region 913. Among them, the second lead regions 914 are bonded to the electrodes 922, 923, and the leads 912A, 912B may be formed to have an overall bent shape for bonding.

To assemble to the capacitor assembly 900, the capacitor assembly 900 may further include the bracket 920 having the capacitor 910 fitted and coupled to electrically connect a circuit board (not shown) to the capacitor 910. The bracket 920 has a planar base 921, and the electrodes 922, 923 for being bonded to the pair of leads 912A, 912B are formed on one surface (more specifically, an upper surface) of the base 921. The electrodes 922, 923 may be formed side by side to correspond to positions where the leads 912A, 912B are seated, and electrically connect the capacitor 910 to the circuit board so that the capacitor 910 is electrically conducted. The leads 912A, 912B and the electrodes 922, 923 may be bonded through soldering. In addition, the bracket 920 includes a pair of accommodating partition walls 924 formed to protrude from an upper surface of the base 921 to surround an outer surface of the main body 911 of the capacitor 910. The accommodating partition wall 924 enables the capacitor 910 to be stably seated on the bracket 920. The accommodating partition wall 924 may have a plurality of slits 925, and the capacitor 910 may be pressurized to be stably seated on the bracket 920 through the slits 925. A pressurization process will be described later.

Figure 2:
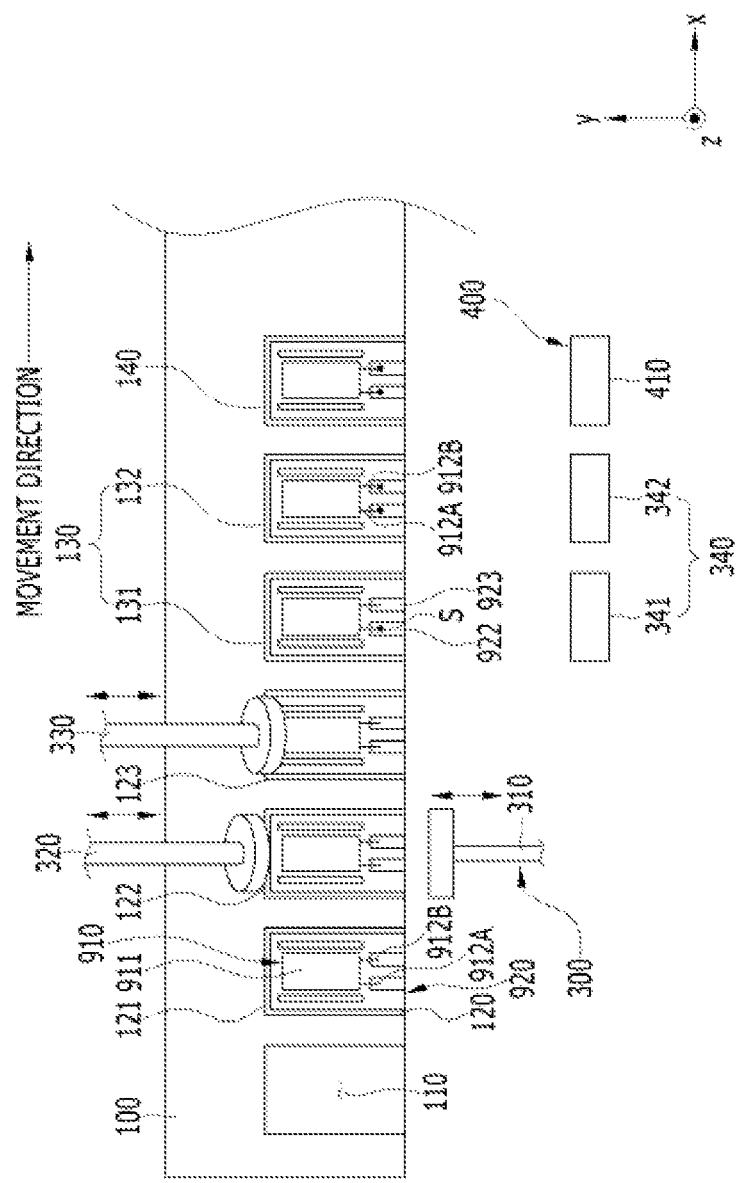
FIGS. 2 and 3 are schematic perspective views of the apparatus for assembling the capacitor assembly according to the present disclosure.
Figure 3:
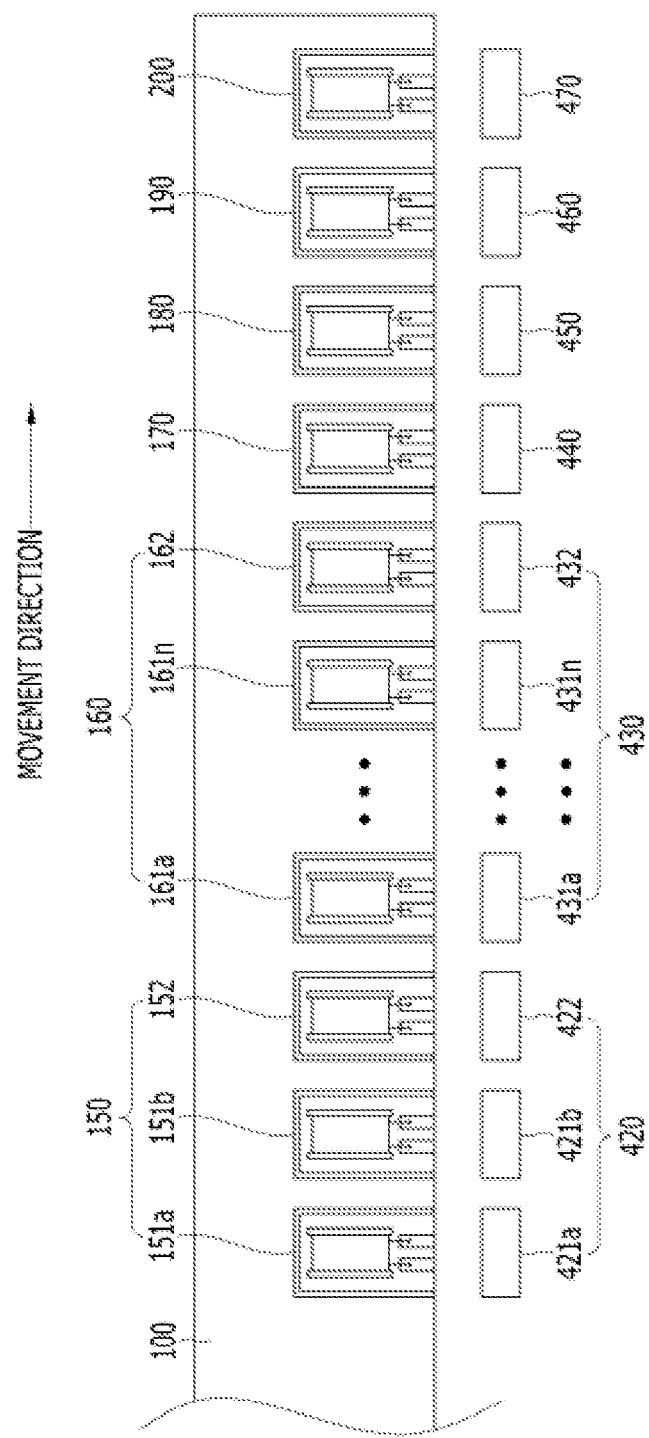
Figure 4:
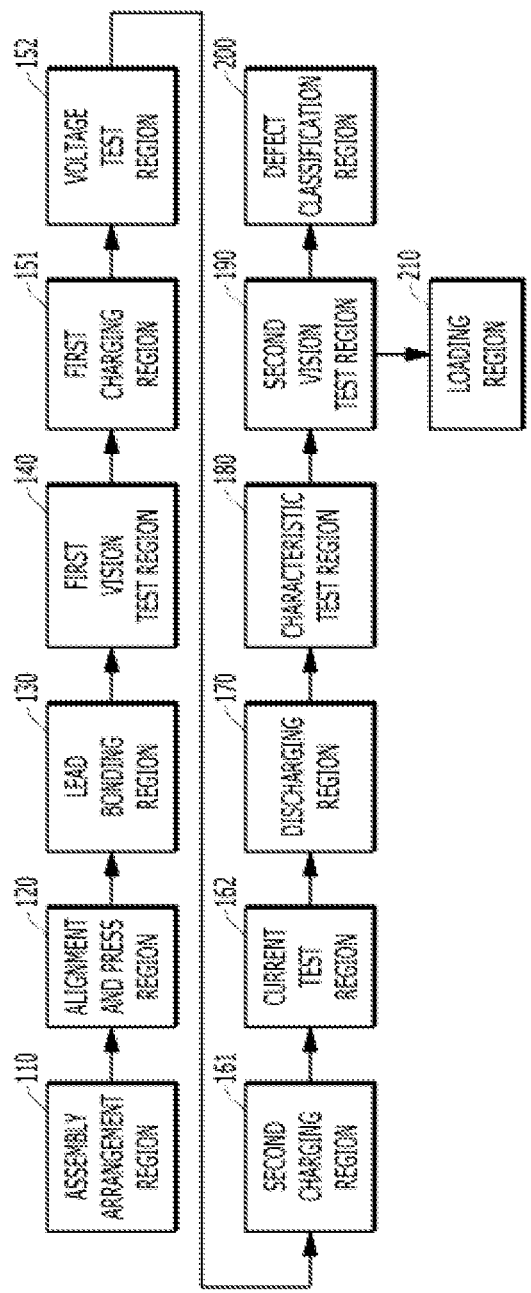
FIG. 4 is a schematic view schematically showing a region proceeding according to the movement of a conveyor module in the apparatus for assembling the capacitor assembly according to the present disclosure.

FIGS. 2 and 3 are schematic perspective views of the apparatus for assembling the capacitor assembly according to the present disclosure, and FIGS. 2 and 3 correspond to a continuous configuration other than a separate configuration, in which a conveyor module 100 is connected, and a first power test region 150 and a first power test module 420 after a first vision test region 140 and a first vision test module 410, which will be described later, may be continuously formed. FIG. 4 is a schematic view schematically showing a region proceeding according to the movement of a conveyor module in the apparatus for assembling the capacitor assembly according to the present disclosure.

Referring to FIGS. 2 to 4, the apparatus for assembling the capacitor assembly according to the present disclosure may include a plurality of assembling regions 110, 120, 130, 140, 150, 160, 170, 180, 190, 200, 210, and include the conveyor module 100 having the assembling regions moved in one direction in a state where the capacitor assembly 900 is seated in the assembling region, a processing module 300 mechanically, electrically coupling the capacitor 910 to the bracket 920 to assemble to the capacitor assembly 900, and an test module 400 testing whether the capacitor assembly 900 mechanically, electrically coupled by the processing module 300 is defective.

Referring to FIGS. 2 and 4, the conveyor module 100 in the apparatus for assembling the capacitor assembly according to the present disclosure may include the plurality of assembling regions moved in one direction in the movement direction. At this time, the 'assembling region' is not necessarily limited to a region that causes deformation of the capacitor assembly, and may mean all regions on the conveyor module 100 in which the capacitor 910 or the bracket 920 is pressurized, the leads 912A, 912B and the electrodes 922, 923 are bonded, and the capacitor assembly 900 is tested. Meanwhile, the assembling region may be formed in the form of a tray, and formed to engraved in the size in which the bracket 920 may be arranged.

In addition, the conveyor module 100 may move the assembling regions in one direction, and the assembling regions may be moved every preset unit time (T) by a certain distance. At this time, the certain distance may be an interval at which each assembling region is substantially formed, and the preset unit time (T) may refer to a time when each assembling region stops and stays at one point. In other words, when the certain distance at which the assembling region moves is, for example, denoted by 'd', one assembling region may repeat an operation of stopping at one point and staying for the unit time (T), and then moving to another point separated by the distance (d) in one direction for a movement time (T'), and staying at another point for the unit time (T) again.

First, each of the capacitor 910 and the bracket 920 is arranged in a capacitor assembly arrangement region 110. At this time, the bracket 920 may be arranged on the capacitor assembly arrangement region 110, and the capacitor 910 may be arranged between the pair of accommodating partition walls 924 of the bracket 920. An interval between the accommodating partition walls 924 of the bracket 920 corresponds to an outer diameter of the main body 911 of the capacitor and therefore, the capacitor 910 may be stably accommodated in the bracket 920.

Subsequently, describing the assembling regions of the conveyor module 100, the assembling regions may include a processing region 120, 130 including an alignment and press region 120 where the capacitor assembly 900 is mechanically assembled, and a lead bonding region 130 where the capacitor 910 and the bracket 920 constituting the capacitor assembly 900 are electrically connected.

FIG. 5 is a reference view showing a process of performing alignment or press in the alignment and press region in the apparatus for assembling the capacitor assembly according to the present disclosure.

Referring to FIGS. 2, 4, and 5, the processing region 120, 130 refers to a region where the capacitor 910 and the bracket 920 receive a physical force to assemble to the capacitor assembly 900, and after the processing region 120, 130, the capacitor assembly 900 serves as an integral body. In some cases, the alignment and press region 120 may include a capacitor assembly alignment region 121, a first press region 122 where the capacitor assembly is pressurized in first and second directions, and a second press region 123 where the capacitor assembly is pressurized from the second direction. The capacitor assembly alignment region 121 is a region where the capacitor 910 and the bracket 920 arranged, respectively, in the aforementioned capacitor assembly arrangement region 110 are aligned. At this time, various methods may be used as the method for aligning the capacitor 910 and the bracket 920, but the capacitor assembly alignment region 121 may serve as a region where the capacitor 910 and the bracket 920 temporarily stand by before moving to the first press region 122. The apparatus for assembling the capacitor assembly according to the present disclosure may correct the disarrangement if the capacitor 910 and the bracket 920 are disarranged before being coupled by a bracket alignment module 310, a capacitor main body pressurization module 320, and a lead pressurization module 330, which will be described later.

Meanwhile, the processing module 300 may be formed at a position corresponding to the processing region 120, 130. More specifically, the processing module 300 may include the bracket alignment module 310 moving in parallel in the first direction to adjust a position of the bracket 920 so that the bracket 920 is correctly positioned in the first press region 122, and the capacitor main body pressurization module 320 moving in parallel in the second direction perpendicular to the first direction to pressurize the main body 911 of the capacitor 910 to be accommodated between the accommodating partition walls 924 of the bracket 920. In the first press region 122, the bracket alignment module 310 and the capacitor main body pressurization module 320 may be arranged, and may serve to fit and couple the capacitor 910 to be accommodated between the accommodating partition walls 924 of the bracket 920. At this time, the bracket alignment module 310 may align the position of the bracket 920 for accurate coupling. In other words, the position of the bracket 920 is aligned so that the capacitor 910 arranged on the bracket 920 is also correctly positioned, and the capacitor main body pressurization module 320 accurately pressurizes the main body 911 of the capacitor to be fitted between the accommodating partition walls 924.

Referring to FIG. 2, the first direction may be a positive direction of y-axis perpendicular to the movement direction, and a direction pressurizing one side surface of the bracket 920. In addition, the second direction perpendicular to the first direction may be a negative direction of z-axis. Preferably, the bracket alignment module 310 may first operate to push and align the bracket 920 in the first direction, and then the capacitor main body pressurization module 320 may operate to couple the capacitor 910 to the bracket 920.

After the main body 911 of the capacitor is fitted and coupled between the accommodating partition walls 924, the leads 912A, 912B may be bent so that the pair of electrodes 922, 923 formed on the base 921 of the bracket 920 and the leads 912A, 912B of the capacitor 910 are in contact with each other. The second press region 123 may be formed adjacent to the first press region 122, and unlike the first press region 122 pressurizing the main body 911 of the capacitor and the bracket 920, the second press region 123 may pressurize the leads 912A, 912B of the capacitor 910. Meanwhile, the leads 912A, 912B may be pressurized by the lead pressurization module 330, and the lead pressurization module 330 may move in parallel in the second direction, which is the same direction as that of the capacitor main body pressurization module 320. As shown in FIG. 2, since the main body 911 of the capacitor is arranged at a position higher than the leads 912A, 912B based on the y-axis, a position value of the y-axis of the capacitor main body pressurization module 320 may be set to be higher than a position value of the y-axis of the lead pressurization module 330. Meanwhile, the lead pressurization module 330 pressurizes and bends the leads 912A, 912B, and may apply a pressurization force within a range in which the leads 912A, 912B are not broken to the leads 912A, 912B.

After the capacitor 910 and the bracket 920 are mechanically coupled, the capacitor 910 and the bracket 920 may also be electrically coupled. After the pressurization process is performed in the alignment and press region 120, the capacitor assembly 900 may be moved to the lead bonding region 130 for electrically connecting the capacitor 910 to the bracket 920. The processing module corresponding to the corresponding region may be formed in the lead bonding region 130, and therefore, a lead bonding module 340 of the processing module 300, which treats an electrically conductive material to electrically connect the leads 912A, 912B of the capacitor 910 to the electrodes 922, 923 of the bracket 920, may be formed in the lead bonding region 130.

The lead bonding module 340 may include a first lead bonding module 341 and a second lead bonding module 342, and electrically connects the leads 912A, 912B to the electrodes 922, 923, respectively, through the electrically conductive material. For example, the first lead bonding module 341 may bond a first lead 912A and a first electrode 922, and the second lead bonding module 342 may bond a second lead 912B and a second electrode 923. FIG. 2 shows that each of the first lead bonding module 341 and the second lead bonding module 342 separately performs the bonding, but the present disclosure is not necessarily limited thereto, and the first lead 912A and the first electrode 922, and the second lead 912B and the second electrode 923 may also be simultaneously bonded by one lead bonding module 340.

Meanwhile, various methods for bonding the leads 912A, 912B and the electrodes 922, 923 may be used, but preferably, a resistance welding method for performing the bonding through the heat generated by the contact resistance with respect to the portion that is bonded while applying the mechanical pressure may be used so that the leads 912A, 912B and the electrodes 922, 923 have bonding portions S. However, the present disclosure is not limited thereto, and the leads 912A, 912B may be bonded through a conductive solder to pass an electrical signal by using the soldering treatment method.

FIG. 6 is a reference view showing a process of performing a vision test in the apparatus for assembling the capacitor assembly according to the present disclosure.

Referring to FIGS. 2 to 4 and 6, when the processing in the processing region 120, 130 is completed, a plurality of test steps of testing whether the processed capacitor assembly 900 normally operates are performed. At this time, the conveyor module 100 includes a plurality of test regions 140, 150, 160, 170, 180, 190 where the test steps are performed, and like the processing module 300, the test module 400 may be formed at a position corresponding to each test region to test the capacitor assembly 900.

The test region includes the vision test region 140, 190 where the bonding states of the leads 912A, 912B are visually tested to test whether the capacitor assembly 900 formed by the coupling in the processing region 120, 130 is defective. The vision test region 140, 190 includes the first vision test region 140 and a second vision test region 190, and each vision test region 140, 190 may be formed to correspond to the plurality of vision test modules 410, 460 visually detecting whether the leads 912A, 912B are bonded. More specifically, the vision test modules 410, 460 may include the first vision test module 410 detecting whether the leads 912A, 912B are bonded from the second direction, and a second vision test module 460 detecting whether the leads 912A, 912B are bonded from the first direction.

Referring to FIGS. 2 and 6, the first vision test module 410 including a first camera C1 facing the second direction (i.e., the negative direction of z-axis) is formed. The first vision test module 410 detects the bonding states of the leads 912A, 912B by capturing an upper surface of the capacitor assembly 900. At this time, as a criterion determining the bonding state, whether there is the mechanical defect may be determined comprehensively in consideration of the shape, area, etc. of the bonding portion S treated by the lead bonding module 340 in the lead bonding region 130. In addition, the second vision test module 460 including a second camera C2 facing the first direction (i.e., the positive direction of y-axis) may be formed, and the second vision test module 460 detects the bonding states of the leads 912A, 912B by capturing a side surface of the capacitor assembly 900. In particular, the second vision test module 460 may detect the flatness of the capacitor assembly 900, and determine that there is the mechanical defect if the flatness does not satisfy a specified criterion.

FIG. 6 shows that the first vision test module 410 and the second vision test module 460 are formed to be performed within the same process, but this is for the convenience of description, and the first vision test by the first vision test module 410 and the second vision test by the second vision test module 460 may also be substantially performed separately. For example, the flatness test by the second vision test module 460 may be performed just before classifying the defect of the capacitor assembly 900, and therefore, a voltage test module 422, a current test module 432, and a characteristic test module 450 performing the electrical test, which will be described later, may be formed between the first vision test module 410 and the second vision test module 460 performing the mechanical test.

Meanwhile, the test region may include electrical test regions where the electrical characteristics of the capacitor assembly 900 are tested. In the electrical test region, whether the electrical characteristics of the capacitor assembly 900 may normally operate in an actual circuit is tested.

Referring to FIGS. 3 and 4, the test region may sequentially include a first power test region 150 where the voltage characteristics of the capacitor assembly 900 are tested, a second power test region 160 where the current characteristics of the capacitor assembly 900 are tested, a discharging region 170 where the power charged in the capacitor assembly 900 in the first power test region 150 and the second power test region 160 is discharged, and a characteristic test region 180 where the characteristics of the capacitor 910 including a capacitance of the capacitor 910 are tested.

Meanwhile, as described above, the test modules corresponding thereto may be arranged in each test region. In other words, the first power test region 150 may be formed with the first power test module 420 including first charging modules 421a, 421b charging the capacitor 910 for a first charging time, and the voltage test module 422 testing an applied voltage from the capacitor 910 charged by the first charging modules 421a, 421b. In addition, after the test of the voltage test module 422, the second power test region 160 may be formed with a second power test module 430 including second charging modules 431a, 431b charging the capacitor 910 again for a second charging time, and the current test module 432 testing the current applied to the capacitor 910. Meanwhile, when the tests (voltage test and current test) of the first power test module 420 and the second power test module 430 are completed, the discharging region 170 may be formed with a discharging module 440 formed as a ground (GND) to discharge the remaining power of the capacitor 910.

Hereinafter, the voltage test by the first power test module 420 and the current test by the second power test module 430 will be described in detail. Referring to FIG. 3, the first power test region 150 is formed with a plurality of first charging regions 151a, 151b and the first charging modules 421a, 421b corresponding thereto. When the time staying in each charging region is denoted by the unit time (T), the capacitor 910 may be charged by the two first charging modules 421a, 421b for 2 unit times as exemplarily shown in FIG. 3. The capacitor 910 charged by the first charging modules 421a, 421b may be subjected to the applied voltage test by the voltage test module 422, and classified as the defect if a measured voltage value does not fall within a normal voltage range.

Likewise, the second power test region 160 is formed with a plurality of second charging regions 161a to 161n and second charging modules 431a to 431n corresponding thereto. When the time staying in each charging region is denoted by the unit time (T), the capacitor 910 may be charged by the n second charging modules 431a to 431n for n unit times as exemplarily shown in FIG. 3. The capacitor 910 charged by the second charging modules 431a to 431n may be subjected to the applied current test by the current test module 432, and classified as the defect if a measured current value does not fall within a normal current range.

Meanwhile, since the capacitor 910 should be smoothly charged for the current test, the second charging time may be set to be longer than the first charging time. More specifically, to smoothly charge the capacitor 910 for the current test, the second charging time performed during the applied current test may have a unit time of 2 to 6 times the first charging time. For example, if the first charging time is 4 unit times, the second charging time may be formed to have 8 to 24 unit times.

Meanwhile, since one charging module (this is a concept including the first charging module and the second charging module) charges the capacitor 910 for the 1 unit time, each of the N first charging modules may perform the charging by dividing the first charging time into the 1 unit time when the first charging time is N unit times, and each of the 2N to 6N second charging modules may perform the charging by dividing the second charging time into the 1 unit time. As described above, each charging module may charge the capacitor 910 by dividing the charging time into the 1 unit time, thereby enabling the regular movement of the conveyor module 100. In addition, there is an advantage in that it is possible to adjust the number of first charging modules and the number of second charging modules as described above so that the second charging time is set to be longer than the first charging time, thereby preventing the defect of the capacitor assembly 900 that may be caused in the process of performing the test in the first power test module 420 and the second power test module 430.

When the applied voltage test and the applied current test in the first power test region 150 and the second power test region 160 are completed, the capacitor 910 constituting the capacitor assembly 900 is discharged by the discharging module 440 formed in the discharging region 170. At this time, the discharging module 440 may be formed as the ground (GND).

When the capacitor 910 is completely discharged, the characteristic test may be performed by the characteristic test module 450 measuring the characteristics of the capacitor 910 including a capacitance (C). The characteristic test module 450 may test the characteristics of the capacitor 910 itself constituting the capacitor assembly 900, and determine the capacitor 910 as the electrically defective product if the results having undesired characteristics (capacitance and polarity) are measured.

FIG. 7 is a schematic view for classifying a defect in the apparatus for assembling the capacitor assembly and a method for assembling the capacitor assembly according to the present disclosure, and FIG. 8 is a view schematically showing the current status of the defect monitored by a display part over unit time in the apparatus for assembling the capacitor assembly and the method for assembling the capacitor assembly according to the present disclosure.

Referring to FIGS. 3, 4, 7, and 8, the assembling regions of the conveyor module 100 in the apparatus for assembling the capacitor assembly according to the present disclosure may include a loading region 210 removing and loading the normal assembly 900 from the conveyor module 100 for commercialization, and a defective product classification region 200 determining whether the capacitor assembly 900 is defective depending upon the test result in the aforementioned test region to classify it as at least one item. Likewise, a corresponding defective product classification module 470 may be arranged in the defective product classification region 200.

The defect classification of the capacitor assembly 900 by the defective product classification module 470 will be described with reference to FIGS. 7 and 8. The defect of the capacitor assembly 900 may be determined by the module testing the mechanical defect (the first vision test module 410 and the second vision test module 460) and the module testing the electrical defect (the voltage test module 422, the current test module 432, and the characteristic test module 450), which are described above. At this time, the defect of the capacitor assembly 900 may be classified into at least one item, and this item may be classified into a mechanically defective assembly and an electrically defective assembly in a broad scope. More specifically, the mechanically defective assembly may be a concept including a bonding defect 810 determined by the first vision test module 410, and a flatness defect 850 determined by the second vision test module 460. In addition, the electrically defective assembly may be a concept including a voltage defect 820 determined by the voltage test module 422, a current defect 830 determined by the current test module 432, and a characteristic defect 840 determined by the characteristic test module 450.

According to the aforementioned defect item classification, an assembly of the bonding defect 810 may be classified as a first defect classification 811, an assembly of the voltage defect 820 may be classified as a second defect classification 821, an assembly of the current defect 830 may be classified as a third defect classification 831, an assembly of the characteristic defect 840 may be classified as a fourth defect classification 841, and an assembly of the flatness defect 850 may be classified as a fifth defect classification 851 and therefore, they may be loaded in different loading boxes (not shown), respectively. There is an advantage in that a user who uses the apparatus for assembling the capacitor assembly according to the present disclosure may easily confirm which portion the defect frequently occurs by examining the amount of defective assembly loaded in each loading box, thereby improving the defect rate.

Meanwhile, whether there are the defects 810, 820, 830, 840, 850 shown in FIG. 7 is illustrative, and does not necessarily mean that whether there is the defect is tested in the order of the bonding defect—the voltage defect—the current defect—the characteristics defect—the flatness defect. The order of testing whether there is the defect may be changed.

Referring to FIG. 8, the apparatus for assembling the capacitor assembly according to the present disclosure may further include a display part 500 capable of visually displaying the results obtained by the test modules in the test regions. At a specific time (t=t1), whether the capacitor assembly 900 positioned in each test region is defective is displayed on the display part 500. For example, a first defect E1 occurs in the capacitor assembly 900 positioned in an (N+6)th region, and a second defect E2 occurs in the capacitor assembly 900 positioned in an (N+5)th region. In addition, it is confirmed that a third defect E3 occurs in the capacitor assembly 900 positioned in an (N+3)th region, a fourth defect E4 occurs in the capacitor assembly 900 positioned in an (N+2)th region, and a fifth defect E5 occurs in the capacitor assembly 900 positioned in an (N+1)th region. In an Nth region, which is the defect classification region, the capacitor assembly defect classification may be performed depending upon the aspects of these defects, and the capacitor in each region may be moved from an Nth position to an (N−1)th position at a new time (t=t1+T) when the unit time (T) has elapsed. There is an advantage in that the user may easily confirm whether the defect occurs in the capacitor assembly 900 and the form of the defect through the display part 500.

Meanwhile, the apparatus for assembling the capacitor assembly according to the present disclosure may provide a feedback to the processing module 300 depending upon whether there is the aforementioned defect. For example, when the defective assembly as described above is classified into the mechanically defective assembly and the electrically defective assembly, a control part (not shown) may control the processing module 300 in the processing region 120, 130 to reduce the defect rate if the mechanically defective assembly occurs at a high frequency. For example, it may be determined that the leads 912A, 912B of the capacitor 910 are not normally bonded to the electrodes 922, 923 of the bracket 920 when the capacitor assembly 900 is viewed from the second direction depending upon the test of the first vision test module 410. At this time, the lead bonding module 340 may increase a lead bonding time or increase the amount of solder applied to bond the lead. By increasing the lead bonding time or increasing the amount of solder, the leads 912A, 912B of the capacitor 910 may be stably bonded to the electrodes 922, 923 of the bracket 920, thereby reducing the probability of occurrence of the mechanical defect.

Alternatively, when the second vision test module 460 tests the flatness of the capacitor assembly 900 when viewed from the first direction to determine that the mechanical defect has occurred because the leads 912A, 912B of the capacitor 910 are not flatly bonded, the control part may control the lead pressurization module 330 to increase the lead pressurization intensity to adjust the leads 912A, 912B to be flatly bonded, and the leads 912A, 912B of the capacitor 910 may be stably boned to the electrodes 922, 923 of the bracket 920, thereby reducing the probability of occurrence of the mechanical defect.

Hereinafter, a method for assembling the capacitor assembly according to the present disclosure will be described. In describing the method for assembling the capacitor assembly, the already aforementioned portions in the apparatus for assembling the capacitor assembly will be briefly mentioned or a description thereof will be omitted.

FIG. 9 is a flowchart showing the method for assembling the capacitor assembly using the apparatus for assembling the capacitor assembly according to the present disclosure.

Referring to FIG. 9, the method for assembling the capacitor assembly according to the present disclosure is to couple the capacitor 910 having the leads 912A, 912B with the same length to the bracket 920 including the pair of accommodating partition walls 924 accommodating the capacitor 910 therein to assemble to the capacitor assembly 900. At this time, the method for assembling the capacitor assembly may include processing (S120, S130) the capacitor 910 and the bracket 920 constituting the capacitor assembly 900 to assemble to the capacitor assembly 900, and a plurality of test steps (S140, S150, S160, S170, S180, S190, S200, S210) that test whether the capacitor assembly 900 mechanically, electrically coupled by the processing (S120, S130) is defective, with respect to the capacitor assembly 900 seated on the conveyor module including the plurality of assembling regions, the assembling regions being moved in one direction.

Before the capacitor 910 and the bracket 920 constituting the capacitor assembly 900 are processed through the processing (S120, S130), arranging the capacitor assembly (S110) that arranges the bracket 920 and the capacitor 910 in the conveyor module 100 of the aforementioned apparatus for assembling the capacitor assembly is performed. After the arranging of the capacitor assembly (S110) is performed, the processing (S120, S130) for assembling the capacitor assembly 900 is performed, and the processing (S120, S130) at this time may include aligning and pressing (S120) and bonding the lead (S130) performed after the aligning and pressing (S120).

The aligning and pressing (S120) is a step of coupling the capacitor 910 and the bracket 920 constituting the capacitor assembly 900, and the capacitor 910 may be fitted and coupled between the accommodating partition walls 924 of the bracket 920 by pressurizing the capacitor 910 and the bracket 920 in the first direction and the second direction perpendicular to the first direction to mechanically couple the capacitor 910 to the bracket 920.

More specifically, to align the position of the bracket 920 in the first press region among the assembling regions of the conveyor module, the bracket alignment module may pressurize and correctly position the bracket 920 in the first direction. When the bracket 920 is pushed by the bracket alignment module in one direction and the capacitor 910 is fitted into and coupled to the bracket 920, it is possible to reduce the possibility of occurrence of defect caused by the capacitor 910 coupled thereto at an incorrect position. In addition, the main body 911 of the capacitor 910 may be pressurized in the second direction perpendicular to the first direction so that the main body 911 of the capacitor 910 is fitted and coupled between the accommodating partition walls 924 in the first press region and therefore, fitted into and coupled to the accommodating partition wall 924 of the bracket 920 to be formed as the capacitor assembly 900.

In the aligning and pressing (S120), after the main body 911 of the capacitor 910 is fitted into and coupled to the accommodating partition wall 924 in the first press region, it is necessary to pressurize the leads 912A, 912B so that the leads 912A, 912B of the capacitor 910 are adjacent to the electrodes 922, 923 of the bracket 920. Therefore, in the second press region formed adjacent to the first press region among the assembling regions of the conveyor module, the lead pressurization module 330 may pressurize the leads 912A, 912B in the second direction so that the leads 912A, 912B of the capacitor 910 are in contact with the electrodes 922, 923 of the bracket 920.

According to this pressurization process, the leads 912A, 912B may include the first lead region 913 having one end formed to protrude from the main body 911, the bending region 915 having one end connected to the other end of the first lead region 913 and formed to have a regular angle with the first lead region 913, and the second lead region 914 having one end connected to the other end of the bending region 915 and formed to be substantially parallel to the first lead region 913. Among them, the second lead region 914 may be bonded to the electrodes 922, 923, and the leads 912A, 912B may be formed to have an overall bent shape for bonding. Specifically, the lead pressurization module 330 may provide the pressurization force to the leads 912A, 912B in the second direction, and therefore, the leads 912A, 912B may be formed to have the first lead region 913, the second lead region 914, and the bending region 915. The second lead region 914 may be positioned closer to the electrodes 922, 923 of the bracket 920 than the first lead region 913, and may facilitate the bonding between the leads 912A, 912B and the electrodes 922, 923.

Meanwhile, the bonding of the lead (S130) may bond the leads 912A, 912B and the electrodes 922, 923 by using the soldering method, etc. to electrically connect them, and complete both the mechanical coupling and the electrical coupling between the capacitor 910 and the bracket 920 to assemble to one capacitor assembly 900.

Hereinafter, the method for testing the capacitor assembly 900 assembled through the processing (S120, S130) will be described in detail.

The testing performed in the method for assembling the capacitor assembly according to the present disclosure may include performing a first vision test (S140) that captures the capacitor assembly 900 from the second direction and visually detects whether the leads 912A, 912B and the electrodes 922, 923 are bonded in the bonding of the lead (S130), testing a voltage (S160) that tests whether the capacitor assembly 900 operates in a normal voltage range by charging the capacitor 910 after the performing of the first vision test, testing a current (S180) that tests whether the capacitor assembly 900 operates in a normal current range by charging the capacitor 910 again after the testing of the voltage, testing a characteristic (S200) that discharges the capacitor 910 and tests the characteristics of the capacitor assembly 900 including the capacitance of the capacitor, and performing a second vision test (S210) that captures the capacitor assembly 900 from the first direction perpendicular to the second direction and visually detects whether the leads 912A, 912B and the electrodes 922, 923 are bonded (flatness) in the bonding of the lead (S130).

Among the aforementioned test steps, the performing of the first vision test (S140) and the performing of the second vision test (S210) perform the visual test as to whether the lead is bonded, which may be regarded as testing the mechanical defect. In addition, the testing of the voltage (S160), the testing of the current (S180), and the testing of the characteristic (S200) perform the test through the electrical stimulus such as applying power to the capacitor 910, which may be regarded as testing the electrical defect.

The performing of the first vision test (S140) and the performing of the second vision test (S210) are the steps of visually testing the bonding state of the lead through different directions (the first direction and the second direction) after the bonding of the lead (S130), and may determine whether there is the mechanical defect comprehensively in consideration of the area, shape, etc. of the bonding portion formed by the resistance bonding if the resistance bonding between the leads 912A, 912B and the electrodes 922, 923 is exemplarily performed. Preferably, the performing of the first vision test (S140) may determine the mechanical defect by capturing the capacitor assembly 900 from the second direction to confirm the area, shape, etc. of the bonding portion, and the performing of the second vision test (S210) may determine the mechanical defect by capturing the capacitor assembly 900 from the first direction to confirm the height, shape, etc. of the bonding portion.

The testing of the voltage (S160) tests the voltage applied to the capacitor 910, and the capacitor 910 is charged to perform the testing of the voltage (S160). The performing of the first charging (S150) that charges the capacitor 910 before the testing of the voltage (S160) may charge the capacitor 910 for N unit times (N is a natural number). Meanwhile, to achieve the charging for the N unit times, each of the N first charging modules may be arranged to perform the charging by dividing the charging time into the 1 unit time as described above.

Meanwhile, the testing of the current (S180) tests the current applied to the capacitor 910, and the capacitor 910 is charged to perform the testing of the current (S180). Since the capacitor 910 should be more smoothly charged in the testing of the current (S180) than in the testing of the voltage (S160) due to the characteristics of the test, the performing of the second charging (S170) that charges the capacitor 910 before the testing of the current (S180) may charge the capacitor 910 for 2N to 6N unit times. To achieve the charging for the 2N to 6N unit times, each of the 2N to 6N second charging modules may be arranged to perform the charging by dividing the charging time into the 1 unit time as described above.

After the testing of the voltage (S160) and the testing of the current (S180) are performed, the discharging (S190) that discharges the capacitor 910 may be performed, and the testing of the characteristic (S200) that tests the characteristic value of the capacitor 910 itself may be performed. The testing of the characteristic (S200) may test the physical property values of the capacitor 910 including the capacitance of the capacitor 910. At this time, it is natural that if the results out of the range of the physical property values required by the capacitor assembly 900 are measured, the capacitor assembly 900 may be classified as the electrically defective assembly 900.

The method for assembling the capacitor assembly according to the present disclosure may further include classifying the defect (S220) that classifies the capacitor assembly 900 whose bonding is defective or the capacitor assembly 900 having the capacitor 910 not operated in the normal range in the testing after the aforementioned testing steps are performed. As described above, the classifying of the defect (S220) may classify the defect into the mechanical defect detected through the performing of the first vision test (S140) and the performing of the second vision test (S210) that visually detect whether the leads 912A, 912B and the electrodes are bonded, and the electrical defect detected through the testing of the voltage (S160), the testing of the current (S180), and the testing of the characteristic (S200) that detect the electrical characteristics of the capacitor assembly 900. This classification is to control the processing module 300 in the processing (S120, S130) when the mechanical defect occurs at a higher rate than that of the electrical defect later.

While it has been described that the defective assembly 900 may be classified into two items of the mechanically defective assembly and the electrically defective assembly, the defective assembly 900 is not necessarily classified into two items, and may also be classified into each defect item through the defect determination in each test step. Exemplarily, it is also possible to classify the defect into the first defect (bonding defect), the second defect (voltage defect), the third defect (current defect), the fourth defect (characteristic defect), and the fifth defect (flatness defect).

Meanwhile, if the mechanical defect occurs at a certain rate or more depending upon the aforementioned classifying of the defect (S220), in the processing (S120, S130), the pressurization force applied to the capacitor 910 or the bracket 920 may be adjusted, or the bonding time of the capacitor 910 and the bracket 920 may be adjusted. For example, if the bracket 920 is not correctly aligned to be correctly positioned and therefore, the main body 911 of the capacitor 910 is incompletely coupled to the accommodating partition wall 924 of the bracket 920, the pressurization force applied to the bracket 920 in the first direction may be increased by the bracket alignment module. If the main body 911 of the capacitor 910 is accommodated in the accommodating partition wall 924 at a certain depth or less and therefore, it is determined as the mechanical defect for the reason of the high possibility of separation, the pressurization force applied to the main body 911 of the capacitor 910 in the second direction may be increased by the capacitor main body pressurization module. If the leads 912A, 912B of the capacitor 910 are not formed adjacent to the electrodes 922, 923 of the bracket 920 to be well bonded to the leads 912A, 912B and therefore, it is determined that there is the mechanical defect, the pressurization force applied to the leads 912A, 912B of the capacitor 910 in the second direction may be increased by the lead pressurization module. In addition, if the bonding states of the leads 912A, 912B are defective (the defect of the shape, height, area, etc. of the bonding portion) and therefore, it is determined that there is the mechanical defect, the lead bonding module may adjust the bonding time or the bonding intensity between the capacitor 910 and the bracket 920 to be increased, or the amount of the bonding material to be increased.

It is possible to perform the processing and the test while the capacitor 910 and the bracket 920 automatically move to the plurality of assembling regions through the conveyor module by the apparatus for assembling the capacitor assembly and the method for assembling the capacitor assembly according to the present disclosure described above.

In addition, by simultaneously or sequentially performing the plurality of test steps in the plurality of test regions, it is possible to detect the mechanical and electrical defects that may be caused in the process of assembling the capacitor assembly 900 with high probability, thereby reducing the risk of providing the defective assembly.

In addition, it is possible to determine both the mechanical defect and the electrical defect in the plurality of test steps in the plurality of test regions, and to control the operation of the processing module 300 assembling the capacitor assembly 900 in the processing region if the rate at which the mechanical defect occurs is high to reduce the occurrence of the mechanical defect, thereby improving productivity.

The aforementioned description is merely illustrative of the technical spirit of the present disclosure, and various modifications and changes will be possible by those skilled in the art to which the present disclosure pertains without departing from the essential characteristics of the present disclosure.

Therefore, the exemplary embodiments disclosed in the present disclosure are not intended to limit but to explain the technical spirit of the present disclosure, and the scope of the technical spirit of the present disclosure is not limited to these exemplary embodiments. The scope of the present disclosure should be interpreted by the appended claims, and all technical spirits within the scope equivalent thereto should be interpreted as being included in the scope of the present disclosure.

INDUSTRIAL APPLICABILITY

The present disclosure provides the apparatus for assembling the capacitor assembly, which arranges the capacitor and the bracket in the conveyor module and processes the capacitor and the bracket to be integrally formed to test whether the capacitor assembly normally operates, and the method for assembling the capacitor assembly, which simultaneously performs the assembling steps by the apparatus for assembling the capacitor assembly.

The invention claimed is:

1. An apparatus for assembling a capacitor assembly coupling a capacitor having leads with the same length and a bracket comprising a pair of accommodating partition walls accommodating the capacitor therein to assemble to a capacitor assembly comprising:
   a conveyor module comprising a plurality of assembling regions, and having the assembling regions moved in one direction in a state where the capacitor assembly is seated on the assembling region;
   a processing module mechanically, electrically coupling the capacitor to the bracket to assemble to the capacitor assembly; and
   a test module testing whether the capacitor assembly mechanically, electrically coupled by the processing module is defective; and
   wherein the assembling regions comprise:
      a processing region comprising an alignment and press region where the capacitor assembly is mechanically assembled, and a lead bonding region where the capacitor and the bracket constituting the capacitor assembly are electrically connected;
      a test region comprising a vision test region where a lead bonding state is visually tested and an electrical test region where electrical characteristics of the capacitor assembly is tested to test whether the capacitor assembly formed by the coupling in the processing region is defective; and
      a defective product classification region where whether the capacitor assembly is defective is determined depending upon the test results in the test region to classify it as at least one item,
   wherein the capacitor of the capacitor assembly comprises a pair of leads comprising a first lead region having one end protruding from a main body of the capacitor, a bending region having one end connected to the other end of the first lead region and formed to be bent to have a preset angle with respect to the first lead region, and a second lead region having one end connected to the other end of the bending region and formed in parallel with the first lead region.

2. The apparatus for assembling the capacitor assembly of claim 1, wherein the processing module is formed at a position corresponding to the processing region, and the test module is formed at a position corresponding to the test region to perform the processing of the capacitor assembly and the test of the capacitor assembly, respectively.

3. The apparatus for assembling the capacitor assembly of claim 1, wherein the processing module comprises:
   a bracket alignment module moving in parallel in a first direction to adjust a position of the bracket so that the bracket is correctly positioned in a first press region;
   a capacitor main body pressurization module moving in parallel in a second direction perpendicular to the first direction to pressurize the main body of the capacitor to be accommodated between the accommodating partition walls of the bracket;
   a lead pressurization module moving in parallel in the second direction to pressurize and bend the leads of the capacitor to be in contact with a pair of electrodes formed on a base of the bracket; and
   a lead bonding module treating an electrically conductive material so that the lead of the capacitor and the electrode of the bracket are electrically connected.

4. The apparatus for assembling the capacitor assembly of claim 3, wherein the lead bonding module electrically connects the lead of the capacitor to the electrode of the bracket through a resistance welding treatment.

5. The apparatus for assembling the capacitor assembly of claim 3, wherein the test module comprises a plurality of vision test modules visually detecting whether the lead is bonded, and wherein the vision test module comprises a first vision test module detecting whether the lead is bonded from the second direction, and a second vision test module detecting whether the lead is bonded from the first direction.

6. The apparatus for assembling the capacitor assembly of claim 5, wherein the test module further comprises
   a first charging module charging the capacitor for a first charging time;
   a voltage test module testing an applied voltage from the capacitor charged by the first charging module;
   a second charging module charging the capacitor for a second charging time after the test of the voltage test module;
   a current test module testing a current applied to the capacitor;
   a discharging module formed as a ground to discharge the power of the capacitor after the voltage test and the current test; and
   a characteristic test module measuring the characteristics of the capacitor comprising a capacitance, and
   wherein the second charging time is set to be longer than the first charging time.

7. The apparatus for assembling the capacitor assembly of claim 6, wherein the second charging time has a unit time 2 to 6 times the first charging time.

8. The apparatus for assembling the capacitor assembly of claim 7, wherein the first charging time is N unit times, and each of the N first charging modules performs charging by dividing the first charging time into the 1 unit time, and wherein the second charging time is 2N to 6N unit times, and each of the 2N to 6N second charging modules performs charging by dividing the second charging time into the 1 unit time.

9. The apparatus for assembling the capacitor assembly of claim 6, wherein the voltage test module, the current test module, and the characteristic test module are formed between the first vision test module and the second vision test module.

10. The apparatus for assembling the capacitor assembly of claim 6, wherein the test module further comprises
a defective product classification module determining whether the capacitor assembly is defective by detecting the mechanical defect of the capacitor assembly according to the tests of the first vision test module and the second vision test module, and the electrical defect of the capacitor assembly according to the voltage test module, the current test module, and the characteristic test module to classify it into at least one item.

11. The apparatus for assembling the capacitor assembly of claim 10, wherein the item is classified into a mechanically defective assembly and an electrically defective assembly.

12. The apparatus for assembling the capacitor assembly of claim 11, further comprising: a control part configured to control to apply a feedback to the processing module according to the mechanically defective assembly, wherein the control part increases a bonding time of the lead bonding module if it is determined that there is the mechanical defect of the capacitor assembly depending upon the test of the first vision test module, and wherein the control part increases a pressurization intensity of the lead pressurization module if it is determined that there is the mechanical defect of the capacitor assembly depending upon the test of the second vision test module.

13. The apparatus for assembling the capacitor assembly of claim 1, wherein the conveyor module moves the assembling regions in one direction, and the assembling regions are moved every preset unit time by a certain distance.

14. A method for assembling a capacitor assembly coupling a capacitor having leads with the same length to a bracket comprising a pair of accommodating partition walls accommodating the capacitor therein to assemble to the capacitor assembly, the method comprising:
processing the capacitor and the bracket comprised in the capacitor assembly to assemble the capacitor assembly with respect to the capacitor assembly seated on a conveyor module comprising a plurality of assembling regions, the assembling regions being moved in one direction; and
testing whether the capacitor assembly mechanically, electrically coupled by the processing is defective,
wherein the processing comprises:
aligning and pressing that fits and couples the capacitor between the accommodating partition walls of the bracket by pressurizing the capacitor and the bracket from a first direction and a second direction perpendicular to the first direction to mechanically couple the capacitor to the bracket; and
bonding the lead that performs the bonding to electrically connect the leads of the capacitor to a pair of electrodes formed on one surface of the bracket after the aligning and pressing, and
wherein in the processing, the capacitor of the capacitor assembly comprises a pair of leads comprising a first lead region having one end protruding from a main body of the capacitor, a bending region having one end connected to the other end of the first lead region and formed to be bent to have a preset angle with respect to the first lead region, and a second lead region having one end connected to the other end of the bending region and formed in parallel with the first lead region.

15. The method of claim 14, wherein the aligning and pressing pressurizes and correctly positions the bracket in the first direction to align a position of the bracket in a first press region among the assembling regions of the conveyor module, pressurizes the main body of the capacitor in the second direction perpendicular to the first direction so that the main body of the capacitor is fitted and coupled between the accommodating partition walls in the first press region, and pressurizes the lead of the capacitor in the second direction so that the lead of the capacitor is in contact with the electrode of the bracket in a second press region formed adjacent to the first press region among the assembling regions of the conveyor module.

16. The method of claim 14, wherein the testing comprises
performing a first vision test that captures the capacitor assembly from the second direction and visually detects whether the lead and the electrode are bonded in the bonding of the lead;
testing a voltage that tests whether the capacitor assembly operates in a normal voltage range by charging the capacitor after the performing of the first vision test;
testing a current that tests whether the capacitor assembly operates in a normal current range by charging the capacitor after the testing of the voltage;
testing a characteristic that discharges the capacitor and tests the characteristics of the capacitor assembly comprising a capacitance of the capacitor; and
performing a second vision test that captures the capacitor assembly from the first direction and visually detects whether the lead and the electrode are bonded in the bonding of the lead.

17. The method of claim 16, further comprising: performing a first charging that charges the capacitor for N unit times before the testing of the voltage, and performing a second charging that charges the capacitor for 2N to 6N unit times before the testing of the current, wherein the performing of the first charging performs, by each of N first charging modules, the charging by dividing the charging time into the 1 unit time, and the performing of the second charging performs, by each of 2N to 6N second charging modules, the charging by dividing the charging time into the 1 unit time.

18. The method of claim 14, further comprising: after the testing, classifying a defect that classifies the capacitor assembly whose bonding is defective or the capacitor assembly having the capacitor not operated in a normal range in the testing, wherein the classifying of the defect classifies the defect into a mechanical defect detected through the performing of the first vision test and the performing of the second vision test that visually detect whether the lead and the electrode are bonded, and an electrical defect detected through the testing of the voltage, the testing of the current, and the testing of the characteristic that detect the electrical characteristics of the capacitor assembly.

19. The method of claim 18, wherein if the mechanical defect occurs at a certain rate or more according to the classifying of the defect, in the processing, a pressurization force of the capacitor or the bracket is adjusted, or a bonding time between the capacitor and the bracket is adjusted.

* * * * *